(12) United States Patent
Chuang et al.

(10) Patent No.: US 10,825,498 B2
(45) Date of Patent: Nov. 3, 2020

(54) MAGNETIC RANDOM ACCESS MEMORY STRUCTURE AND MANUFACTURING METHOD OF THE SAME

(71) Applicant: TAIWAN SEMICONDUCTOR MANUFACTURING COMPANY LTD., Hsinchu (TW)

(72) Inventors: Harry-Hak-Lay Chuang, Hsinchu County (TW); Sheng-Chang Chen, Hsinchu County (TW)

(73) Assignee: TAIWAN SEMICONDUCTOR MANUFACTURING COMPANY LTD., Hsinchu (TW)

(*) Notice: Subject to any disclaimer, the term of this patent is extended or adjusted under 35 U.S.C. 154(b) by 0 days.

(21) Appl. No.: 16/683,053

(22) Filed: Nov. 13, 2019

(65) Prior Publication Data

US 2020/0082859 A1   Mar. 12, 2020

Related U.S. Application Data

(62) Division of application No. 15/933,777, filed on Mar. 23, 2018, now Pat. No. 10,490,248.

(Continued)

(51) Int. Cl.
*G11C 11/00*   (2006.01)
*G11C 11/16*   (2006.01)
(Continued)

(52) U.S. Cl.
CPC .......... *G11C 11/161* (2013.01); *G11C 11/005* (2013.01); *H01L 27/222* (2013.01);
(Continued)

(58) Field of Classification Search
CPC .............. G11C 11/161; G11C 11/1675; G11C 11/1659; G11C 11/16; G11C 11/155; G11C 11/14; G11C 11/165
See application file for complete search history.

(56) References Cited

U.S. PATENT DOCUMENTS 10,454,021 B2    10/2019   Sung et al.
2005/0006682 A1*  1/2005   Bae .......................... B82Y 10/00
                                                              257/295

(Continued)

FOREIGN PATENT DOCUMENTS

CN   105977376      7/2019
TW   201727959      8/2017

OTHER PUBLICATIONS

Office Action and Search Report dated Jun. 2, 2020 issued by the Taiwan Intellectual Property Office for counterpart application No. 107142131.

(Continued)

*Primary Examiner* — Hien N Nguyen
(74) *Attorney, Agent, or Firm* — WPAT, P.C., Intellectual Property Attorneys; Anthony King (57) ABSTRACT

The present disclosure provides a magnetic random access memory structure, including an array region, and a logic region adjacent to the array region. The logic region includes a bottom electrode via, a magnetic tunneling junction layer over the bottom electrode via, a top electrode over the MTJ, a conformable oxide layer over the MTJ and the top electrode, and a silicon oxide layer over the conformable oxide layer. The conformable oxide layer and the silicon oxide layer extend from the array region to the logic region.

20 Claims, 13 Drawing Sheets

Related U.S. Application Data (60) Provisional application No. 62/593,005, filed on Nov. 30, 2017.

(51) Int. Cl.
*H01L 27/22* (2006.01)
*H01L 43/12* (2006.01)
*H01L 43/10* (2006.01)
*H01L 43/08* (2006.01)

(52) U.S. Cl.
CPC .............. *H01L 43/08* (2013.01); *H01L 43/10* (2013.01); *H01L 43/12* (2013.01)

(56) References Cited

U.S. PATENT DOCUMENTS

| | | | | |
|---|---|---|---|---|
| 2010/0181633 | A1* | 7/2010 | Nam | ................... H01F 10/3268 257/421 |
| 2011/0062536 | A1* | 3/2011 | Min | ....................... H01L 43/08 257/421 |
| 2015/0311433 | A1 | 10/2015 | Bae et al. | |
| 2016/0218145 | A1* | 7/2016 | Han | ....................... H01L 43/12 |
| 2019/0165041 | A1* | 5/2019 | Chuang | ..................... H01L 4/02 |

OTHER PUBLICATIONS

English Abstract Translation of Office Action dated Jun. 2, 2020 issued by the Taiwan Intellectual Property Office for counterpart application No. 107142131.

U.S. Pat. No. 10,454,021 is a family patent to Foreign Reference TW 201727959.

Office Action and Search Report dated Aug. 20, 2020 issued by the Chinese Patent Office for counterpart application No. 201811440404.7.

English translation of the Office Action and Search Report dated Aug. 20, 2020 issued by the Chinese Patent Office for counterpart application No. 201811440404.7.

* cited by examiner

MAGNETIC RANDOM ACCESS MEMORY STRUCTURE AND MANUFACTURING METHOD OF THE SAME

CROSS REFERENCE TO RELATED APPLICATIONS

This application is a divisional of U.S. application Ser. No. 15/933,777, filed Mar. 23, 2018, and claims the benefit thereof under 35 U.S.C. 120, which claims the benefit of prior-filed provisional application No. 62/593,005, filed Nov. 30, 2017.

BACKGROUND

Semiconductors are used in integrated circuits for electronic applications, including radios, televisions, cell phones, and personal computing devices. One type of well-known semiconductor device is the semiconductor storage device, such as dynamic random access memories (DRAMs), or flash memories, both of which use charges to store information.

A more recent development in semiconductor memory devices involves spin electronics, which combines semiconductor technology and magnetic materials and devices. The spin polarization of electrons, rather than the charge of the electrons, is used to indicate the state of "1" or "0." One such spin electronic device is a spin torque transfer (STT) magnetic tunneling junction (MTJ) device.

MTJ device includes free layer, tunnel layer, and pinned layer. The magnetization direction of free layer can be reversed by applying a current through tunnel layer, which causes the injected polarized electrons within free layer to exert so-called spin torques on the magnetization of free layer. Pinned layer has a fixed magnetization direction. When current flows in the direction from free layer to pinned layer, electrons flow in a reverse direction, that is, from pinned layer to free layer. The electrons are polarized to the same magnetization direction of pinned layer after passing pinned layer; flowing through tunnel layer; and then into and accumulating in free layer. Eventually, the magnetization of free layer is parallel to that of pinned layer, and MTJ device will be at a low resistance state. The electron injection caused by current is referred to as a major injection.

When current flowing from pinned layer to free layer is applied, electrons flow in the direction from free layer to pinned layer. The electrons having the same polarization as the magnetization direction of pinned layer are able to flow through tunnel layer and into pinned layer. Conversely, electrons with polarization differing from the magnetization of pinned layer will be reflected (blocked) by pinned layer and will accumulate in free layer. Eventually, magnetization of free layer becomes anti-parallel to that of pinned layer, and MTJ device will be at a high resistance state. The respective electron injection caused by current is referred to as a minor injection.

The present disclosure provides an MRAM structure including MTJ device and manufacturing method of thereof, particularly to an MRAM structure with reduced step height between memory array edge and logic region via simplified manufacturing method to improve cycle time and reduce manufacturing cost.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Conventionally, MRAM structure includes bottom electrode via formation, MTJ formation, top electrode via formation, recap layer formation, photoresist etch back, and extreme low-k material (ELK) etch back, which entail complex procedures and high cost. The conventional MRAM structure still possess the problem of step height being too large, inducing ELK voids between adjacent MTJs. The critical dimension of the conventional MRAM structure is also difficult to scale down.

The present disclosure provides an MRAM structure and manufacturing method. The present disclosure help reducing step height of the MRAM structure, and reducing ELK voids between adjacent MTJs. In addition, replacing the steps of top electrode via formation, recap layer formation, and ELK etch back may improve cycle time and reduce manufacturing cost.

Figure 1:
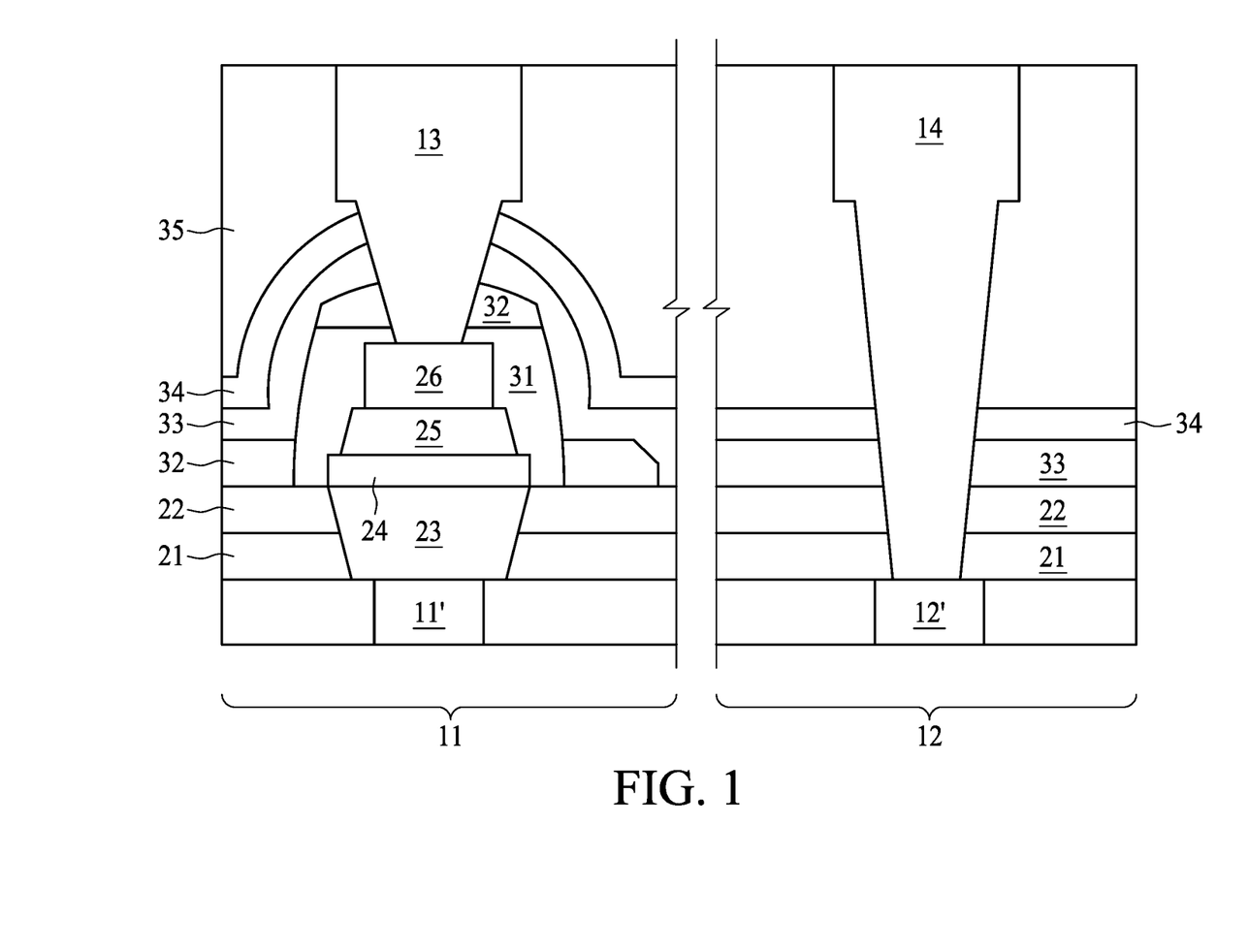
FIG. 1 is a cross section of a magnetic random access memory structure, in accordance with some embodiments of the present disclosure.

Referring to FIG. 1, FIG. 1 is a cross sectional view of a magnetic random access memory (MRAM) structure, in accordance with some embodiments of the present disclosure. The MRAM structure includes an array region 11 and a logic region 12 adjacent to the array region 11. The array region 11 includes memory array, while the logic region 12 includes at least one transistor. The array region 11 includes a silicon carbide (SiC) layer 21, a silicon-rich oxide (SRO) layer 22 over the SiC layer 21, a bottom electrode via (BEVA) 23, a bottom electrode 24, a magnetic tunneling junction (MTJ) 25 over the BEVA 23, a top electrode 26 over the MJT layer 25. In some embodiments, at least the bottom electrode 24, the MTJ 25, and the top electrode 26 are collectively called an MTJ structure in the present disclosure Still referring to FIG. 1, the array region 11 further includes a sidewall spacer 31 surrounding the MTJ structure, a protection layer 32 over the sidewall spacer 31, a conformable oxide layer 33 over the protection layer 32 and the sidewall spacer 31, a silicon oxide layer 34 over the conformable oxide layer 33, a low-k dielectric layer 35 over the silicon oxide layer 34, and an upper metal layer 13 as oppose to a lower metal layer 11'. In some embodiments, the upper metal layer 13 refers to an upper metal line and an upper metal via.

On the other hand, the logic region 12 includes a lower metal layer 12', a silicon carbide (SiC) layer 21, a silicon-rich oxide (SRO) layer 22 above the SiC layer 21, a conformable oxide layer 33 over the SRO layer 22, a silicon oxide layer 34 over the conformable oxide layer 33, a low-k dielectric layer 35 over the silicon oxide layer 34, and an upper metal layer 14. In some embodiments, the upper metal layer 14 refers to an upper metal line and an upper metal via. Like reference numbers labeled in the array region 11 and the logic region 12 represent identical components.

Referring to FIG. 1, in some embodiments, the conformable oxide layer 33 and the silicon oxide layer 34 extend from the array region 11 to the logic region 12. The conformable oxide layer 33 and the silicon oxide layer 34 are formed simultaneously over the array region 11 and the logic region 12. In some embodiments, area coverage of logic region 12 and the memory region 11 are approximately 98% and 2% of total area of the wafer.

Still referring to FIG. 1, the sidewall spacer 31 surrounds the MTJ 25 and the top electrode 26. In some embodiments, the sidewall spacer 31 further covers a portion of the top surface of the top electrode 26. In some embodiments, the protection layer 32 is over a top surface of the sidewall spacer 31, and further has a portion surrounding the lower section of the sidewall spacer 31 contacting the SRO layer 22. In some embodiments, the conformable layer 33 is over the protection layer 32, while the silicon oxide layer 34 is over the protection layer 32, both in the array region 11 and the logic region 12.

Referring to FIG. 2A through 2L, in some embodiments, a method for manufacturing an MRAM structure includes forming an MTJ structure in the array region 11, forming the protection layer 32 over the MTJ structure in the array region 11 and in the logic region 12, removing the protection layer 32 in the logic region 12, forming the conformable oxide layer 33 in the logic region 12, forming the low-k dielectric layer (ELK) 35 over the conformable oxide layer 33 in the array region 11 and the logic region 12, forming a dielectric stack 40 over the low-k dielectric layer 35 in the array region 11 and the logic region 12, forming an antireflective coating (ARC) 44 over the dielectric stack 40 in array region 11 and the logic region 12, performing an ARC etch back and stopping the etch at the dielectric stack 40 in the array region 11 and the logic region 12.

Figure 2A:
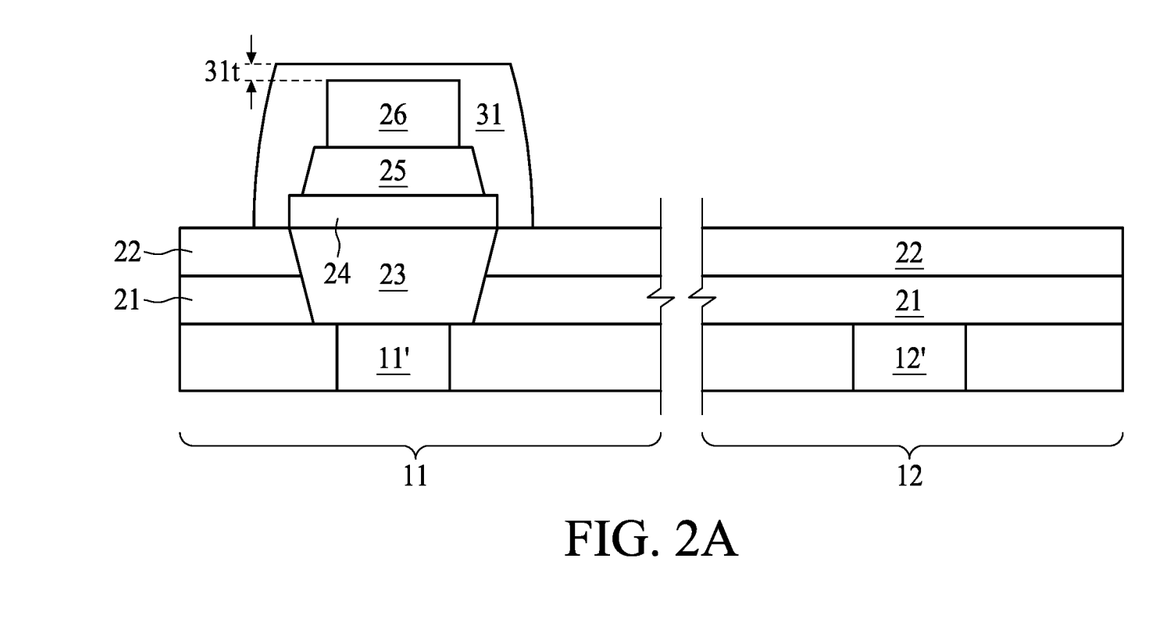
FIG. 2A to FIG. 2L are cross sections of a magnetic random access memory structure fabricated at various stages, in accordance with some embodiments of the present disclosure.

Referring to FIG. 2A, the MRAM structure includes an MTJ 25 at least composed of ferromagnetic materials. A bottom electrode 24 and a top electrode 26 are electrically coupled to the MTJ 25 for signal/bias conveyance. In some embodiments, the BEVA 23 is disposed over and electrically coupled to a lower metal layer 11' within array region 11. In some embodiments, the BEVA 23 possesses a conductive materials filling a trapezoidal recess surrounded by the silicon carbide (SiC) layer 21 and the silicon-rich oxide (SRO) layer 22 above SiC layer 21. Alternatively, the SRO can be replaced or combined with Tetraethyl Orthosilicate (TEOS). In some embodiments, the BEVA 23 may include conductive materials such as metal. A planarization operation, such as a chemical mechanical polishing (CMP) operation, may be applied to a top surface of the BEVA 23. The bottom electrode layer is formed onto the BEVA 23. The bottom electrode layer may include TiN, TaN, W, Al, Ni, Co, Cu or the combination thereof. In some embodiments, a planarization operation, such as a CMP operation, may be applied to a top surface of the bottom electrode layer. In some embodiments, the material of the bottom electrode layer is different from that of the BEVA 23.

The MTJ layer is deposited in a form of multiple material stacks (not illustrated in FIG. 2A) over the bottom electrode layer. The MTJ layer may be formed by a variety of techniques, for example, high-density ionized metal plasma (IMP) deposition, high-density inductively coupled plasma (ICP) deposition, sputtering, physical vapor deposition (PVD), chemical vapor deposition (CVD), low-pressure chemical vapor deposition (LPCVD), plasma-enhanced chemical vapor deposition (PECVD), and the like. The MTJ layer may include ferromagnetic layers, spacers, and a capping layer. The capping layer is formed on the ferromagnetic layer. Each of the ferromagnetic layers may include ferromagnetic material, which may be metal or metal alloy, for example, Fe, Co, Ni, CoFeB, FeB, CoFe, FePt, FePd, CoNi, TbFeCo, CrNi or the like. The spacer may include non-ferromagnetic metal, for example, Ag, Au, Cu, Ta, W, Mn, Pt, Pd, V, Cr, Nb, Mo, Tc, Ru or the like. Another spacer may also include insulator, for example, $Al_2O_3$, MgO, TaO, RuO or the like. The capping layer may include non-ferromagnetic material, which may be a metal or an insulator, for example, Ag, Au, Cu, Ta, W, Mn, Pt, Pd, V, Cr, Nb, Mo, Tc, Ru, Ir, Re, Os, $Al_2O_3$, MgO, TaO, RuO or the like. The capping layer may reduce write current of its associated MRAM cell. The ferromagnetic layer may function as a free layer whose magnetic polarity or magnetic orientation can be changed during write operation of its associated MRAM cell. The ferromagnetic layers and the spacer may function as a fixed or pinned layer whose magnetic orientation may not be changed during operation of its associated MRAM cell. It is contemplated that the MTJ layer may include an antiferromagnetic layer in accordance with other embodiments.

Following the formation of the MTJ layer, a top electrode layer is deposited over the MTJ layer. The top electrode layer may be formed by a variety of techniques, for example, high-density ionized metal plasma (IMP) deposition, high-density inductively coupled plasma (ICP) deposition, sputtering, physical vapor deposition (PVD), chemical vapor deposition (CVD), low-pressure chemical vapor deposition (LPCVD), plasma-enhanced chemical vapor deposition (PECVD), and the like. In some embodiments, the top electrode layer and the bottom electrode layer are made of a same material. In some embodiments, the material of the top electrode layer is different from that of the BEVA 23 and the bottom electrode layer.

A patterning operation is performed on the bottom electrode layer, the MTJ layer, and the top electrode layer to form bottom electrode 24, MTJ 25, and top electrode 26. In some embodiments, the bottom electrode 24, the MTJ 25, and the top electrode 26 appear to have taper shape with a wider section proximal to the bottom electrode 24 and a narrower section proximal to the top electrode 26.

Figure 2B:
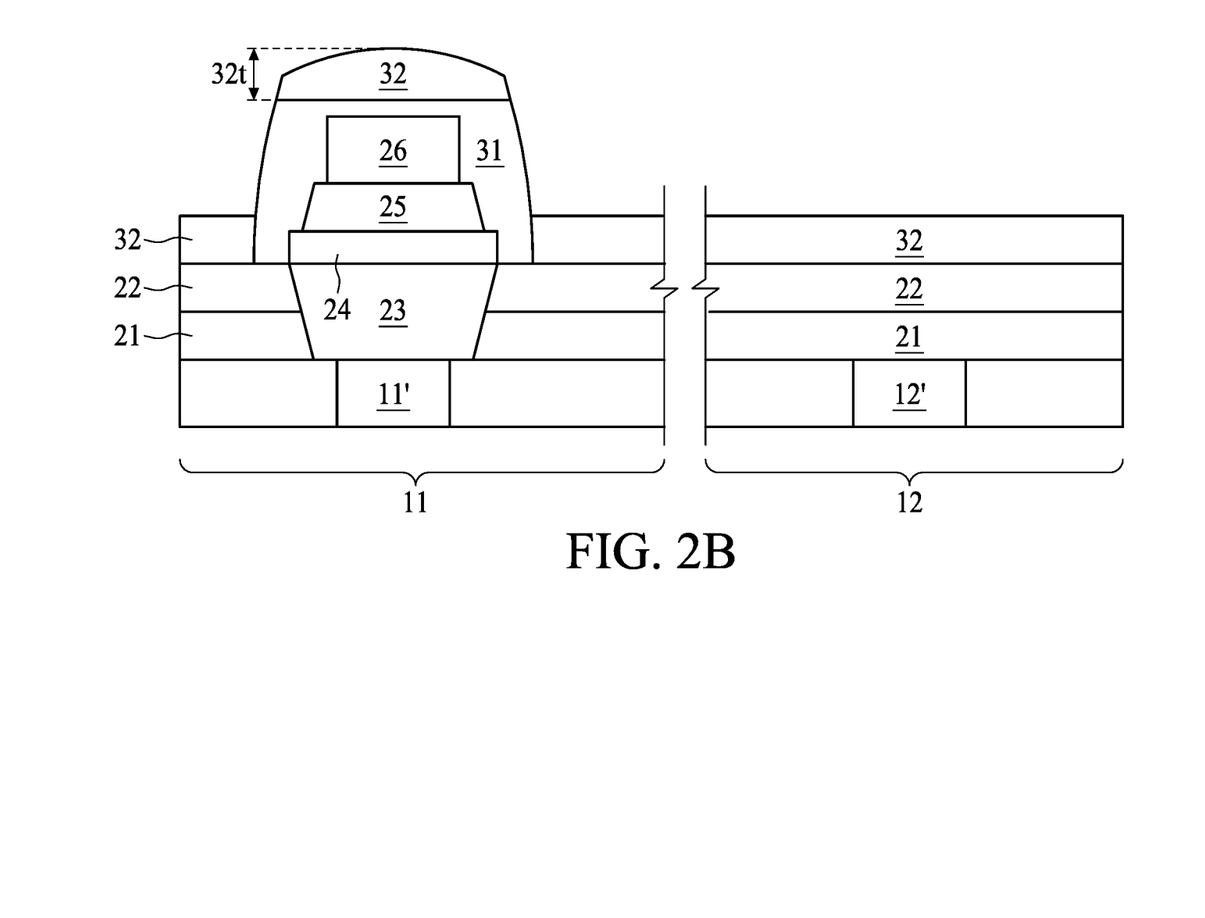

As shown in FIG. 2A, a sidewall spacer 31 is a layer formed to surround the sidewall of the bottom electrode 24, the MTJ 25 and the top electrode 26. In some embodiments, the sidewall spacer 31 may be a silicon nitride layer, which can be formed by a variety of techniques, for example, chemical vapor deposition (CVD), low-pressure chemical vapor deposition (LPCVD), atmospheric pressure chemical vapor deposition (APCVD), and the like. In some embodiments, the sidewall spacer 31 further covers a top surface of the top electrode 26. In some embodiments, the thickness 31t of the sidewall spacer 31 over the top surface of the top electrode 26 is approximately 40 angstrom. The thickness 31t of the sidewall spacer 31 will be subsequently discussed in FIG. 2L. Referring to FIG. 2B, the protection layer 32 is blanket deposited over the SRO layer 22 of the array region 11 and the logic region 12 and the top electrode 26 of the array region 11. In some embodiments, the protection layer 32 can be a silicon carbide (SiC) layer, which can be formed by a variety of techniques, for example, high-density ionized metal plasma (IMP) deposition, high-density inductively coupled plasma (ICP) deposition, sputtering, physical vapor deposition (PVD), chemical vapor deposition (CVD), low-pressure chemical vapor deposition (LPCVD), plasma-enhanced chemical vapor deposition (PECVD), and the like. In some embodiments, the thickness of the protection layer 32 is approximately 400 angstrom. In some embodiments, the protection layer 32 further covers a top surface of the sidewall spacer 31 over the top electrode 26. Due to the poor coverage of forming the protection layer 32 onto a sidewall of the sidewall spacer 31, the thickness of the protection layer 32 over the sidewall of the sidewall spacer 31 is negligible. In some embodiments, the thickness 32t of protection layer 32 over the surface of the sidewall spacer 31 is approximately 400 angstrom to 500 angstrom. The thickness 32t of the protection layer 32 will be subsequently discussed in FIG. 2L.

Figure 2C:
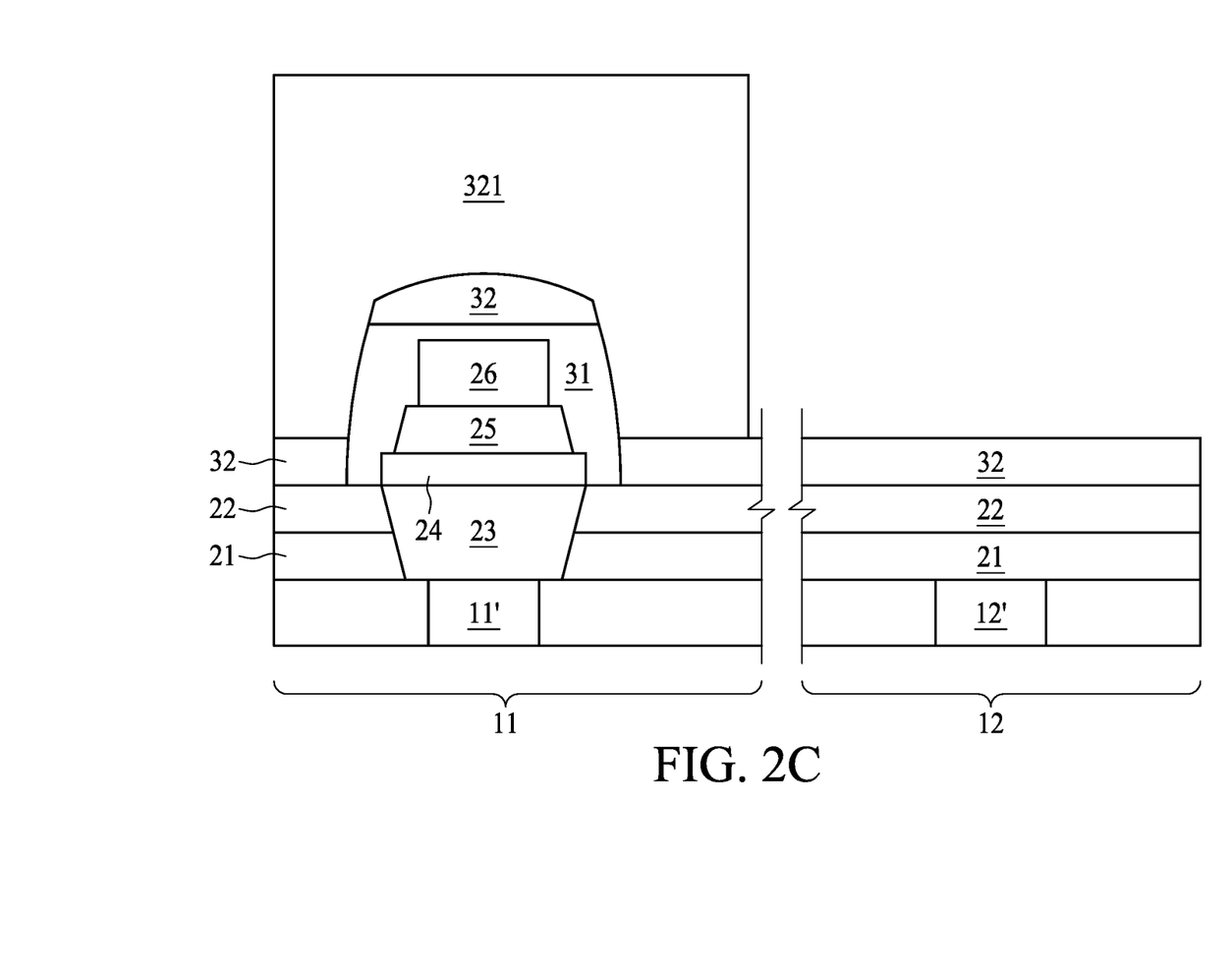
Figure 2D:
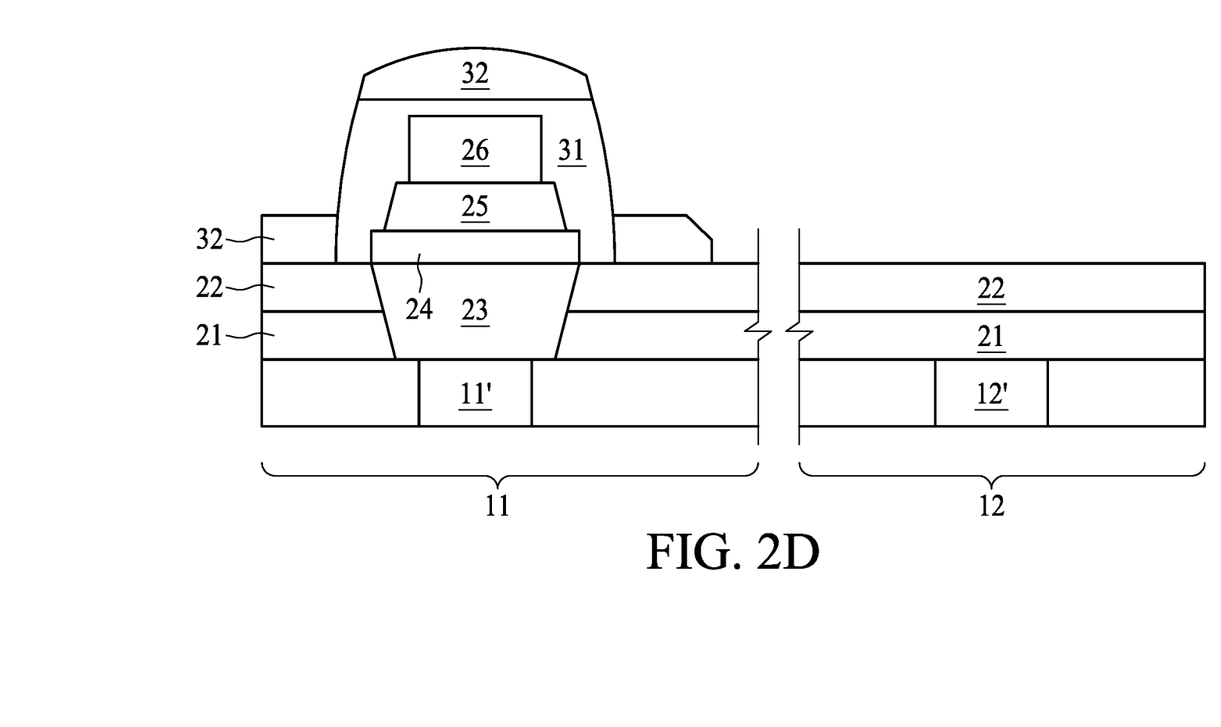

The protection layer 32 within the logic region 12 is subsequently removed in order to reduce the thickness of the logic region 12 above the substrate, as shown in FIG. 2C. In some embodiments, a photoresist 321 is patterned over the protection layer 32 to expose the logic region 12. As shown in FIG. 2C, an etching operation, for example a dry etch operation, can be applied herein to remove the protection layer 32 within the logic region 12. In some embodiments, the dry etch in the present operation includes reactive ion etch (RIE) adopting fluorine-containing gases. After removing the protection layer 32 in the logic region 12, the photoresist 321 in the array region 11 can be removed by applying plasma ashing or stripping. As shown in FIG. 2D, the thickness above the substrate within logic region 12 is reduced by a thickness 32t of protection layer 32. In some embodiments, the thickness 32t of the protection layer 32 remained in the array region 11 is approximately 400 angstrom.

Figure 2E:
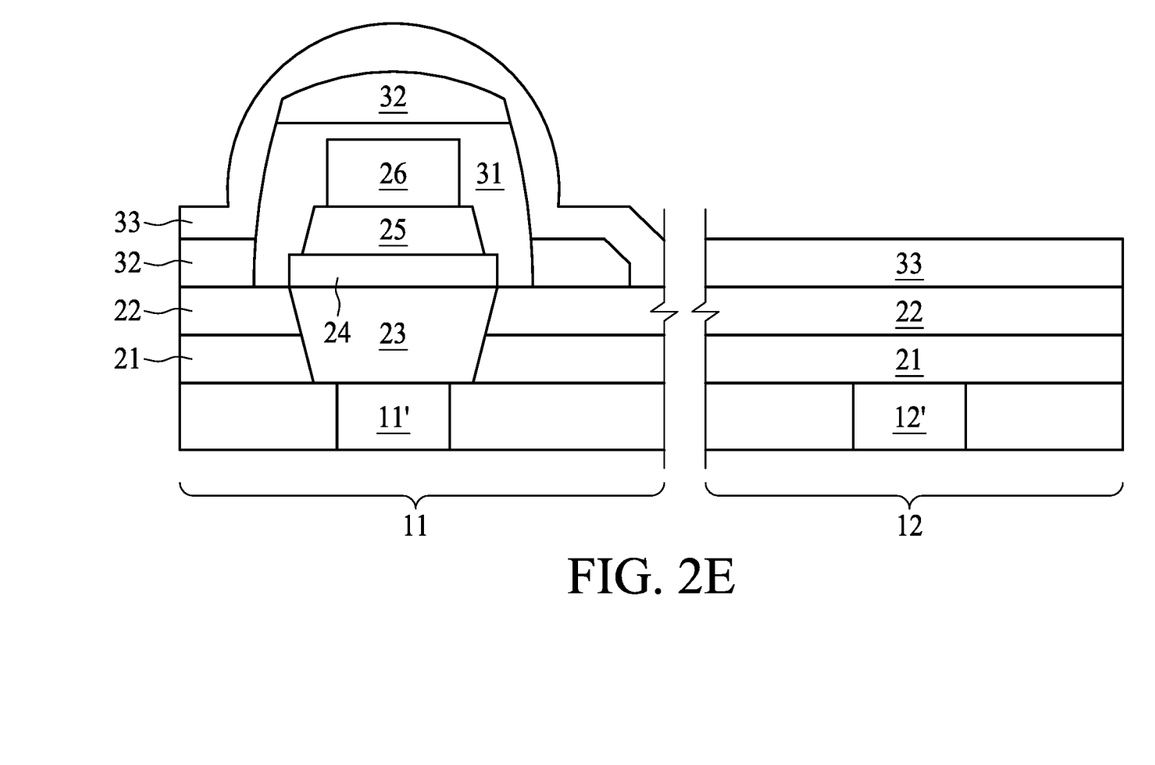
Figure 2F:
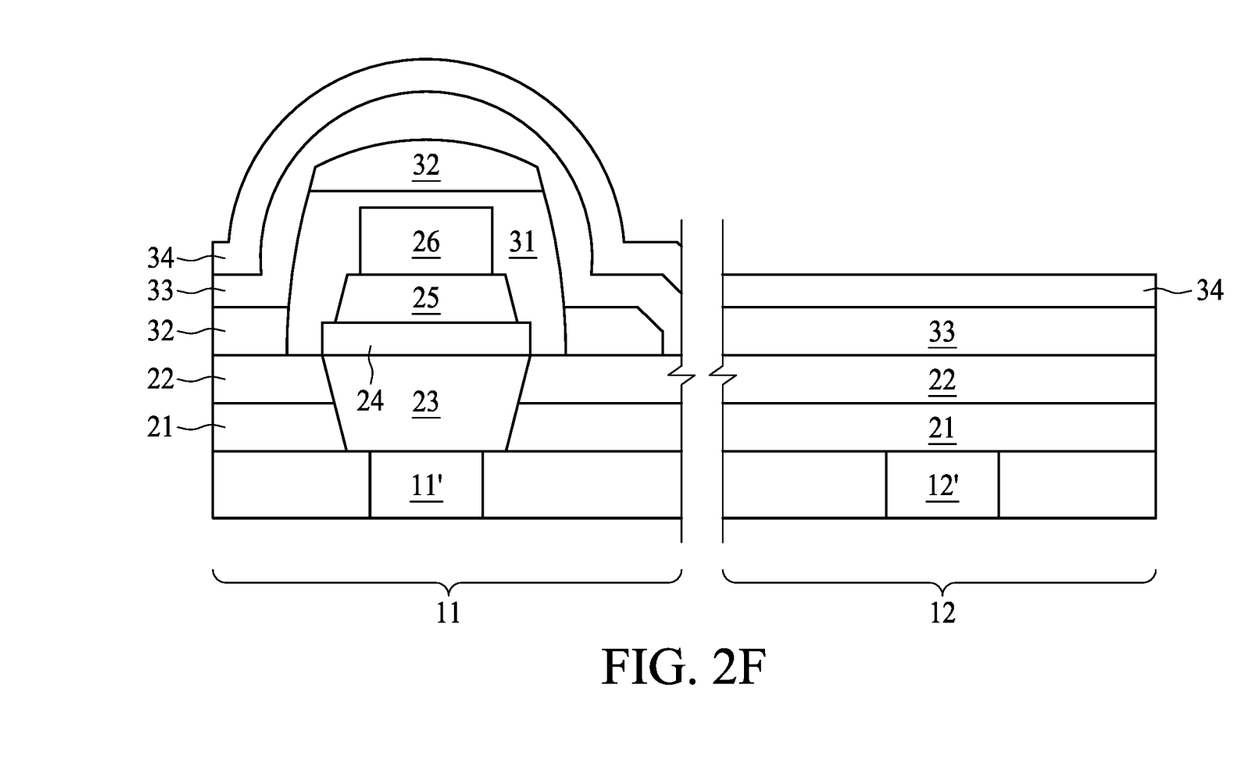

One of the issues of conventional methods of producing MRAM structure is the multiple voids in the low-k dielectric layer 35 due to the large aspect ratio trench between adjacent MTJ structures, the low-k dielectric layer 35 may not be able to close the gaps between two adjacent MTJ structures. Such voids may result in various problems in subsequent processing. Therefore, in some embodiments, the conformable oxide layer 33, as illustrated in FIG. 2E, is formed over the protection layer 32, extending from the array region 11 to the logic region 12. Application of the conformable oxide layer 33 of from about 300 Angstrom to about 500 Angstrom reduces the aspect ratio of the trench between adjacent MTJ structures and thus alleviates the low-k dielectric layer 35 voids problem.

In some embodiments, the conformable oxide layer 33 is a thin-film deposition layer. For example, the conformable oxide layer 33 can be formed by atomic layer deposition (ALD) or plasma enhanced atomic layer deposition (PEALD). ALD is a layer-by-layer deposition process of thin films with conformal coating on 3D structures. The ALD operation may be performed to improve the performance of filling narrow gaps or gaps with high aspect ratios. Precise control of thickness and film properties is facilitated by adding precursors into the vacuum chamber during the process. Meanwhile PEALD is an advanced method of extending the capabilities of ALD by applying radical gas species rather than water as oxidizer during the deposition process. In some embodiments, referring to FIG. 2F, current MTJ structure further includes forming another thin oxide layer 34, for example, Tetraethyl orthosilicate (TEOS) layer of about 150 Angstrom, above the conformable oxide layer 33. The thin oxide layer also extends from the array region 11 to the logic region 12.

Figure 2G:
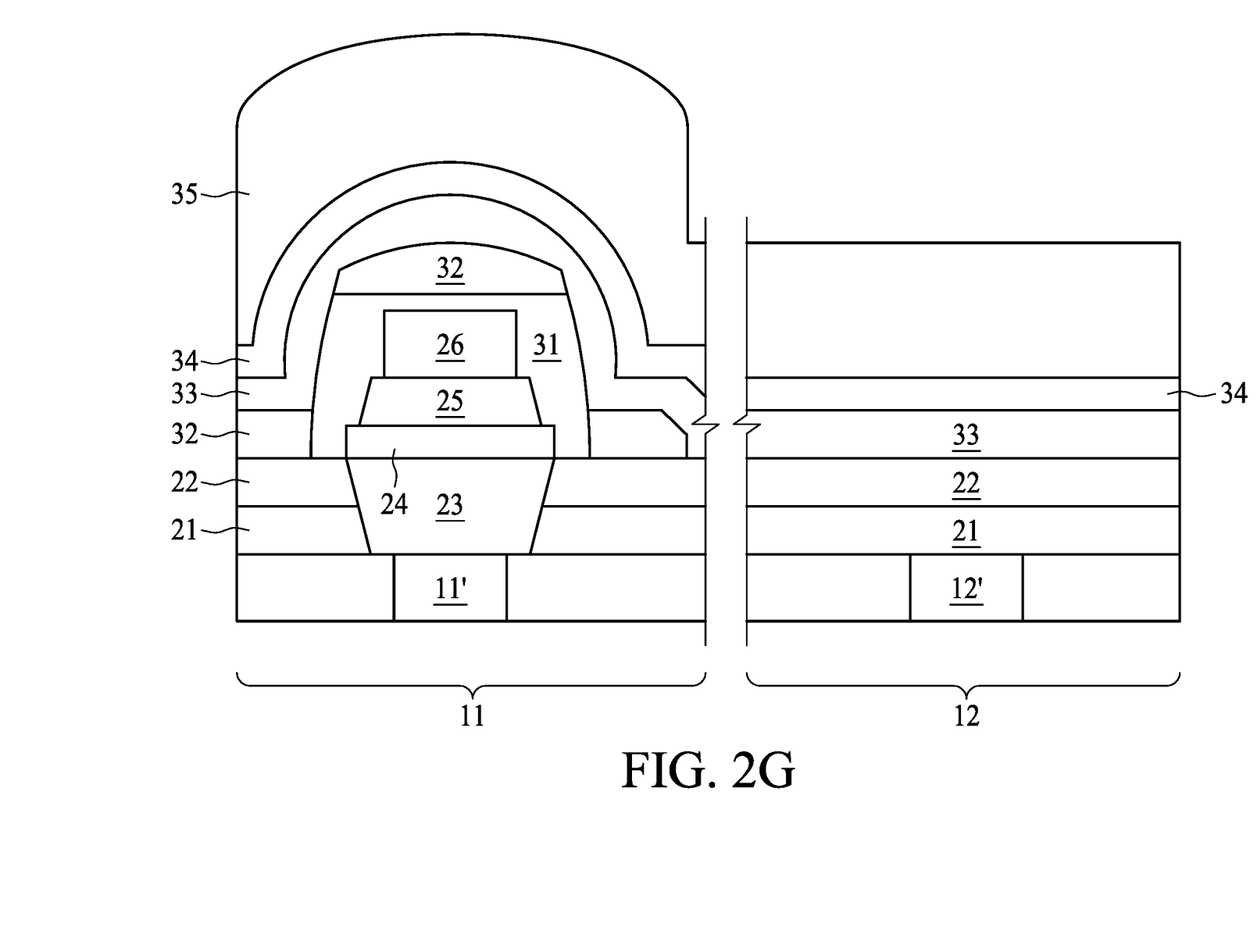
Figure 2H:
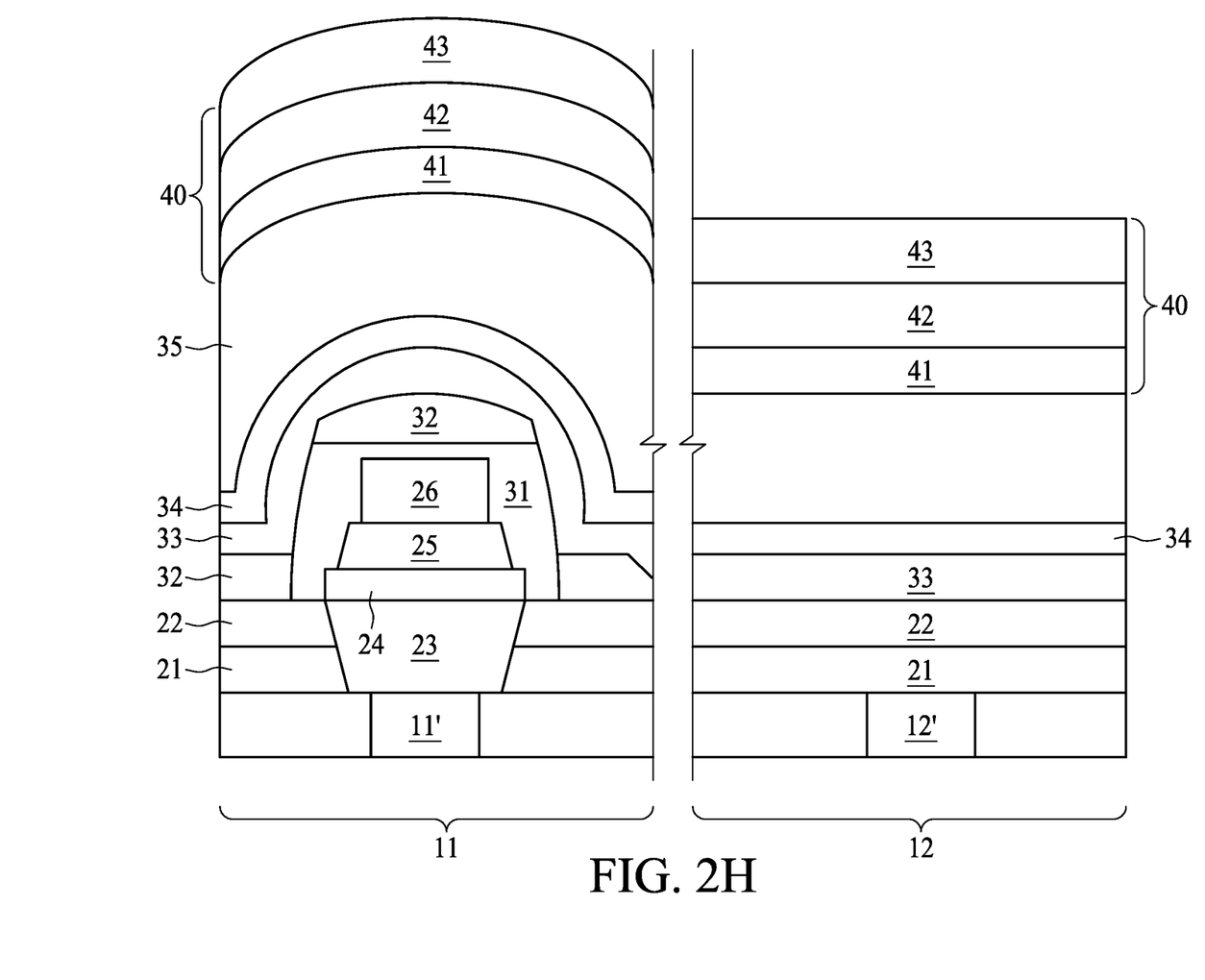

Referring to FIGS. 2G and 2H, the low-k dielectric layer 35 is formed above the conformable oxide layer 33 and the thin oxide layer 34, extending from the array region 11 to the logic region 12. A dielectric stack 40 is further formed over the low-k dielectric layer 35, both in the array region 11 and the logic region 12. In some embodiments, the dielectric stack 40 at least includes a first etch stop layer 41 and a second etch stop layer 42 from bottom to top of the dielectric stack 40. In some embodiments, the first etch stop layer 41 include oxides, such as Tetraethyl orthosilicate (TEOS). In some embodiments, the second etch stop layer 42 include oxynitride, such as Silicon Oxynitride (SiON). Optionally, a third layer 43 may include oxides similar to the first etch stop layer 41. The function of the first etch stop layer 41 and the second etch stop layer 42 will be described subsequently in FIGS. 2I, 2J and 2K.

Figure 2I:
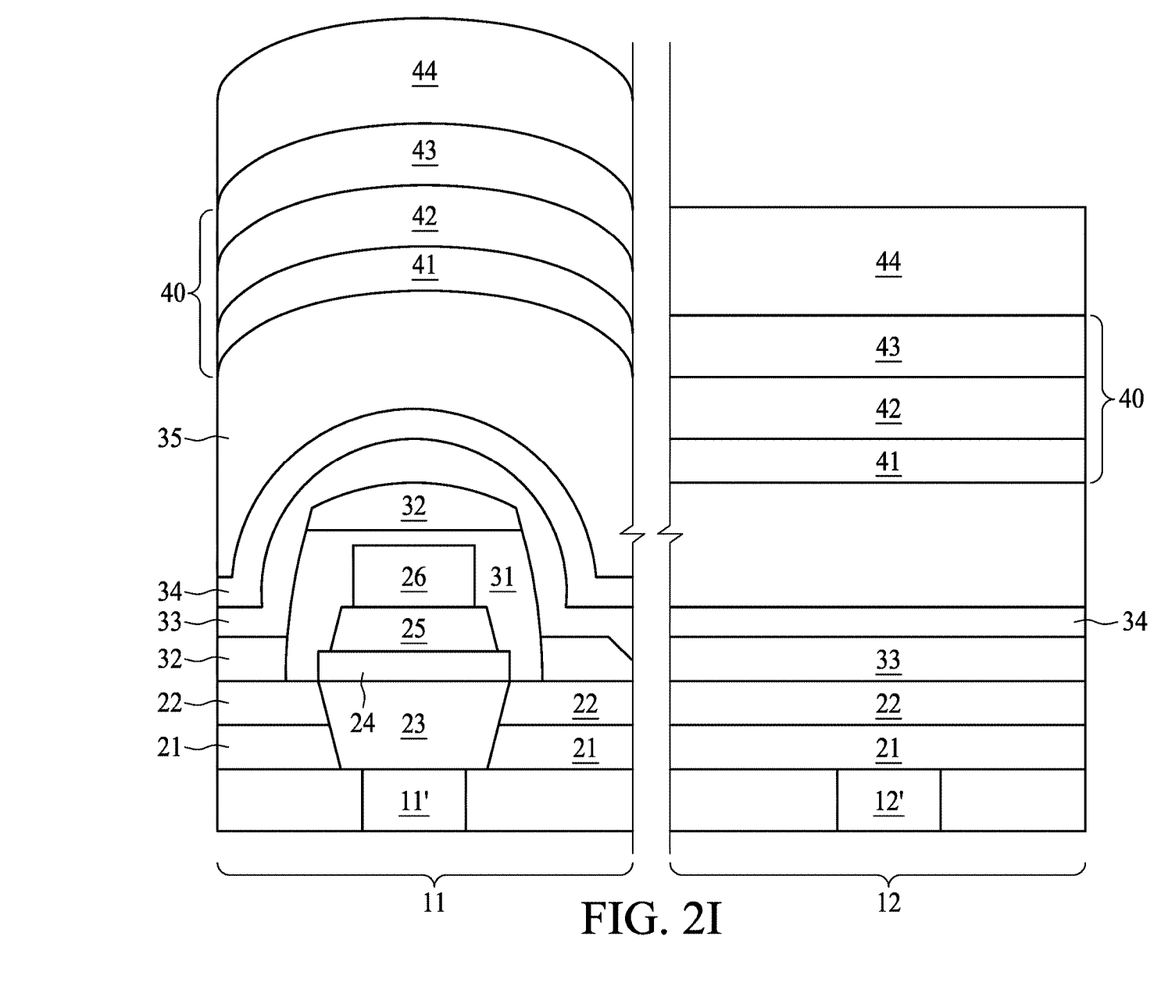
Figure 2J:
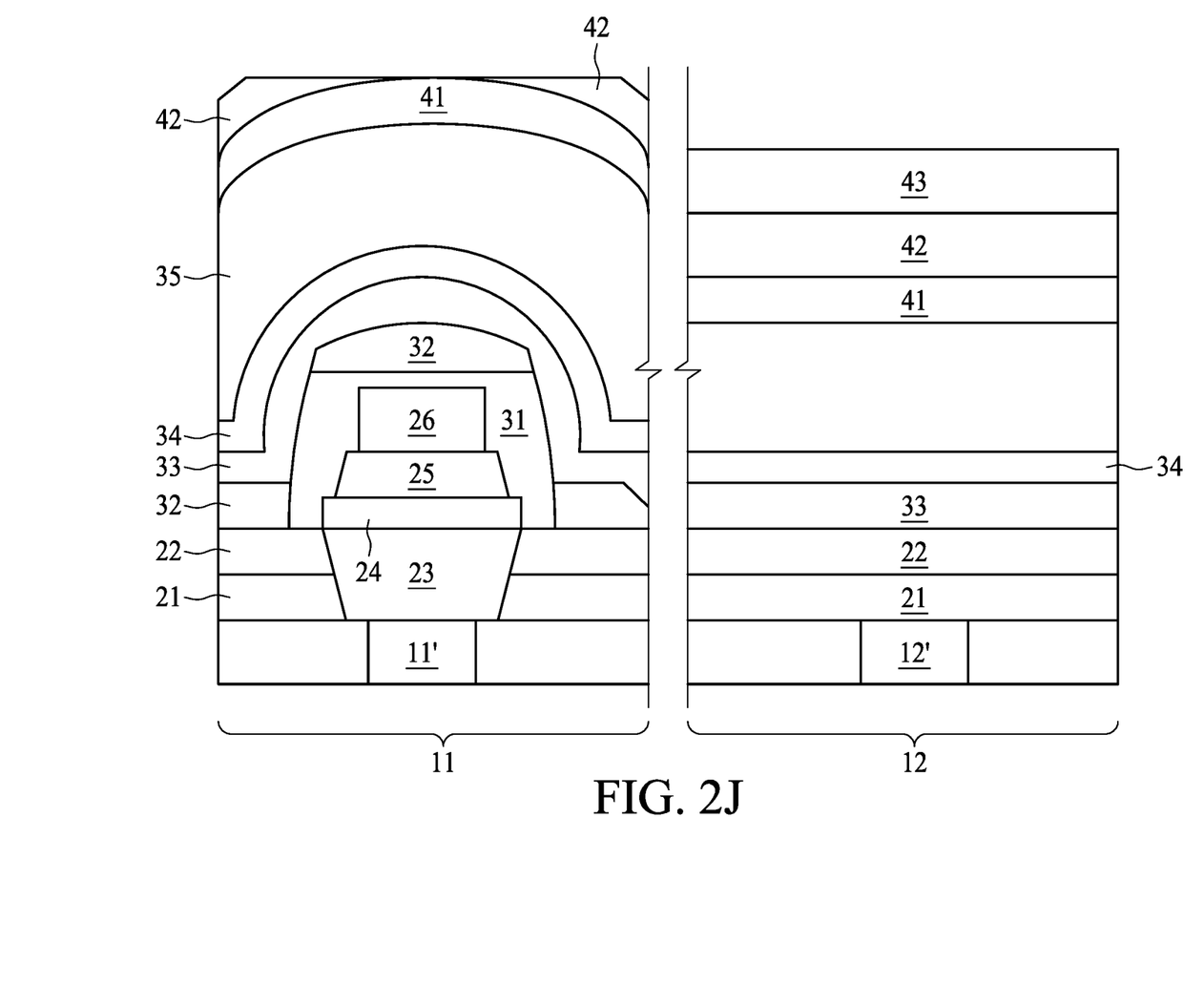

Referring to FIG. 2I, the anti-reflective coating (ARC) 44 is formed over the dielectric stack in the array region 11 and logic region 12. Thence the ARC etch back operation is performed, as shown in FIG. 2J. Conventionally where the first etch stop layer 41 being absent from the MTJ structure, the ARC etch back operation adopts an end point detection mode and overetches to the low-k dielectric 35 of the array region 11. Due to the fact that logic region 12 occupies 98% of the entire substrate area, end point detection start receiving sufficient end point signal when the dielectric layer 43 in the logic region is exposed. Nevertheless, the concurrent etch back operation in the array region 11 has already advanced into the low-k dielectric 35, which has a greater selectivity to etchant used in the etch back operation than that of the dielectric layer 43, causing an undesired recess in the array region 11.

Referring to FIG. 2J, in some embodiments of present disclosure, an additional first etch stop layer 41 is disposed at the bottom of the dielectric stack 40, or at least partially overlapped in a lateral sense with respect to the dielectric layer 43 in the logic region. In such as case, when the end point detection start receiving sufficient end point signal while the dielectric layer 43 in the logic region being exposed, the concurrent etch back in the array region 11 would not advance to the low-k dielectric 35 but rather being halted by the first etch stop layer 41. Alternatively stated, the first etch stop layer 41 effectively prevent the ARC etch back operation from damaging the low-k dielectric 35 in the array region 11.

Figure 2K:
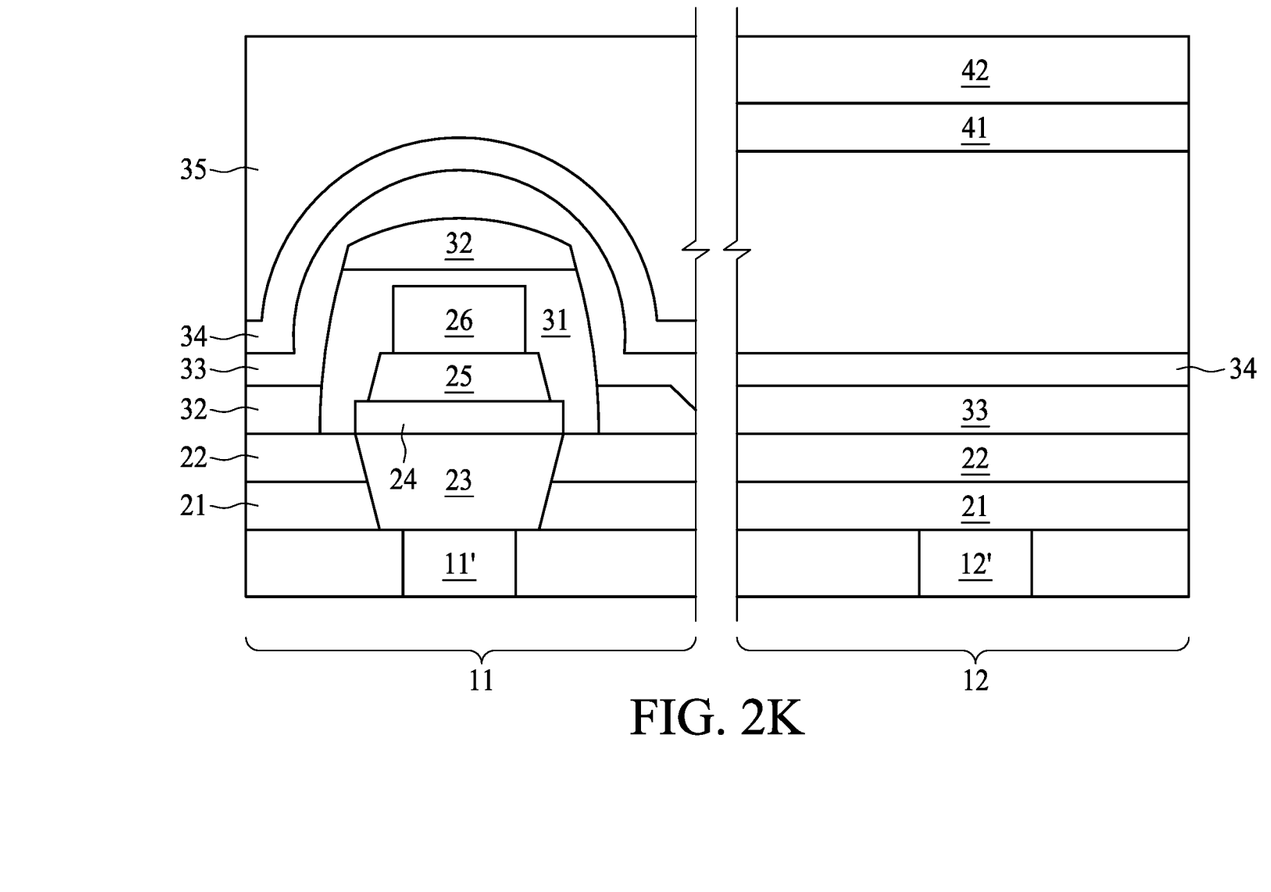

Following FIG. 2J, a planarization operation is performed after the ARC etch back operation on the low-k dielectric 35, as shown in FIG. 2K. In contract to conventional approach where a low-k dielectric etch back is performed, present disclosure provides a planarization operation to remove the low-k dielectric 35 in the array region 11. In some embodiments, the planarization operation includes chemical mechanical polishing (CMP). A selectivity of the low-k dielectric layer 35 is greater than a selectivity of the second etch stop layer 42 with respect to CMP in the planarization operation. Since the planarization operation is performed over the array region 11 and the logic region 12 simultaneously, and that logic region 12 occupies 98% of the entire substrate area, the second etch stop layer 42 functions as an etch stop layer to the low-k dielectric 35 of the array region 11 during the planarization operation. In some embodiments, at the completance of the planarization operation, a top surface of the low-k dielectric 35 in the array region 11 is substantially coplanar to a top surface of the second etch stop layer 42 in the logic region 12.

After the planarization operation is finished, the via trenches in the array region 11 and the logic region 12 are formed simultaneously. In some embodiments, the via trenches are formed by performing dry etch such as reactive-ion etching (RIE). RIE uses chemically reactive plasma to remove material deposited on substrates. The plasma is generated under low pressure by an electromagnetic field, as high-energy ions from the plasma etch the wafer surface.

Figure 2L:
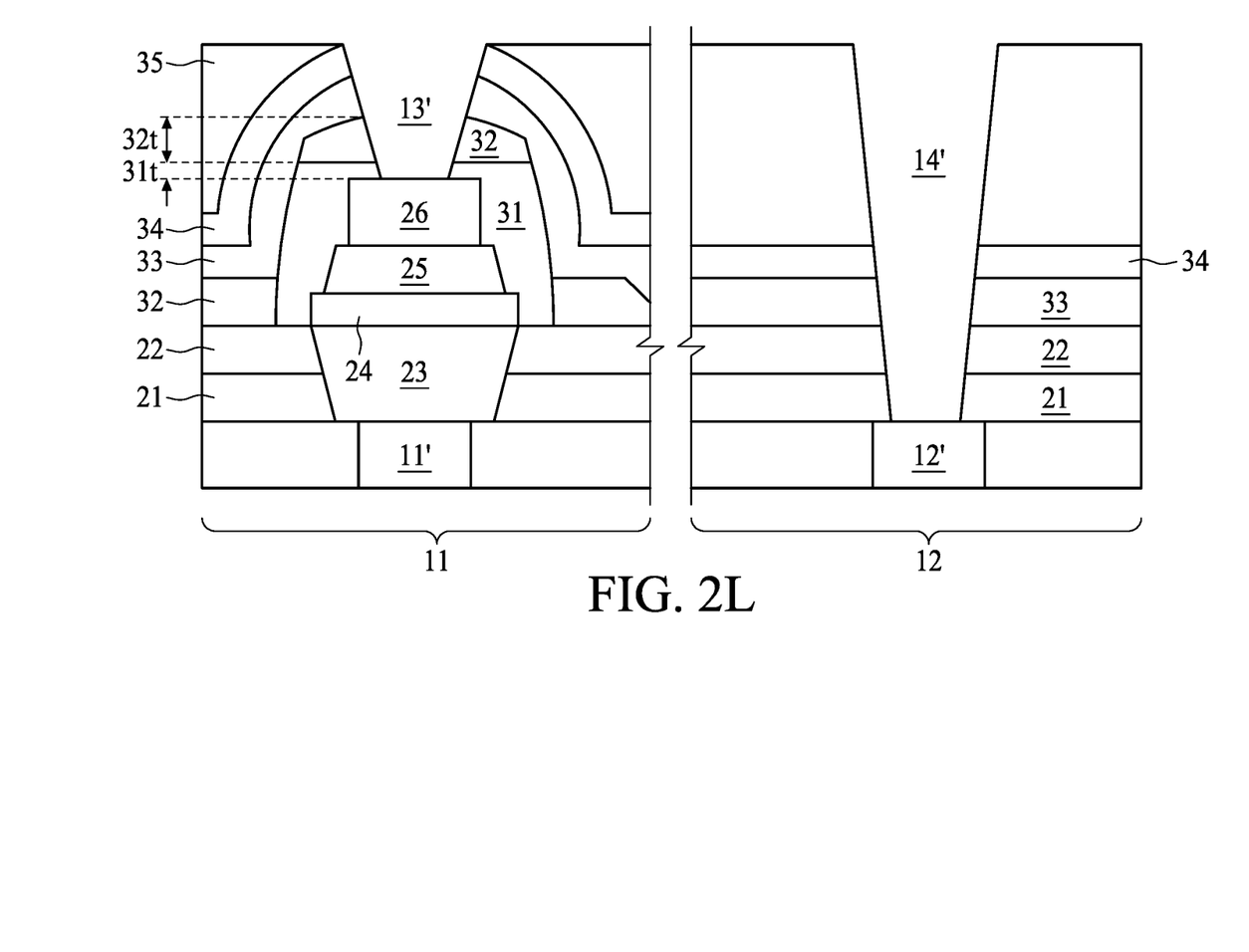

As shown in FIG. 2L, via trench 13' and 14' are formed simultaneously in the array region 11 and the logic region 12. In order to control via trench 13' and 14' formation, the thickness and the materials of the layers above the top electrode 26 in the array region 11 must be correlated to the thickness and the materials of the layers above the lower metal line 12' in the logic region 12. In some embodiments, referring to FIG. 2L, forming via trench 13' of the upper metal layer 13 within the array region 11 requires penetration through the low-k dielectric layer 35, the silicon oxide layer 34, the conformable oxide layer 33, the protection layer 32, and the sidewall spacer 31 above the top electrode 26. Similarly, forming via trench 14' of the upper metal layer 14 in the logic region 12 requires penetration through the low-k dielectric layer 35, the silicon oxide layer 34, the conformable oxide layer 33, the silicon rich oxide layer 22, and the silicon carbide layer 21.

Based on the comparison of the removed compositions in array region 11 and logic region 12, given the conformable oxide layer 33 and the silicon oxide layer 34 both exist in the array region 11 and the logic region 12, duration of via trench 14' formation through the silicon carbide layer 21 and the silicon rich oxide layer 22 in the logic region 12 shall be substantially similar to duration of via trench 13' formation through the protection layer 32 and the sidewall spacer 31 above the top electrode 26 in the array region 11. In some embodiments, the thickness of the silicon carbide layer 21 is approximately 300 angstrom, and the thickness of the silicon rich oxide layer 22 is approximately 200 angstrom. Accordingly, the protection layer 32 can be designed to exceed the thickness of the silicon carbide layer 21, for example, approximate 400 angstrom, to compensate for the duration of via trench 14' formation through the thinner silicon carbide layer 21 and the silicon rich oxide layer 22. In some embodiments, the thickness 31$t$ of the sidewall spacer 31 above the top electrode 26 is approximately 40 angstrom to prevent the via trench 13' formation operation from damaging integrity of the top electrode 26.

After the trench is formed, conductive materials can be further filled into the via trenches 13' and 14', as previously described, and into line trenches (not shown). The metal vias may be formed by a variety of techniques, e.g., electroplating, electroless plating, high-density ionized metal plasma (IMP) deposition, high-density inductively coupled plasma (ICP) deposition, sputtering, physical vapor deposition (PVD), chemical vapor deposition (CVD), low-pressure chemical vapor deposition (LPCVD), plasma-enhanced chemical vapor deposition (PECVD), and the like. In some embodiments, the metal lines and metal vias are filled with electrically conductive material, e.g. copper, gold or another suitable metal or alloy, to form a number of conductive vias. Metal lines and metal vias in different metal layers form an interconnect structure composed of substantially pure copper (for example, with a weight percentage of copper being greater than about 90 percent, or greater than about 95 percent) or copper alloys, and may be formed using the single and/or dual damascene operations. Metal lines and metal vias may be, or may not be, substantially free from aluminum.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

Some embodiments of the present disclosure provide a magnetic random access memory (MRAM) structure, including an array region, and a logic region adjacent to the array region. The logic region includes a bottom electrode via, a magnetic tunneling junction over the bottom electrode via, a top electrode over the MTJ, a conformable oxide layer over the MTJ and the top electrode, and a silicon oxide layer over the conformable oxide layer. The conformable oxide layer and the silicon oxide layer extend from the array region to the logic region.

Some embodiments of the present disclosure provide method for manufacturing a magnetic random access memory structure, the method includes forming a magnetic tunneling junction structure in an array region, forming a protection layer over the MTJ structure in the array region and in a logic region adjacent to the array region, removing the protection layer in the logic region, forming a conformable oxide layer in the array region and the logic region, forming a low-k dielectric layer over the conformable oxide layer in the array region and the logic region, forming a dielectric stack over the low-k dielectric layer in the array region and the logic region, forming an anti-reflective coating over the dielectric stack in the array region and the logic region, and performing the an anti-reflective coating etch back and stopping the etch at the dielectric stack in the array region and the logic region.

Some embodiments of the present disclosure provide method for manufacturing a magnetic random access memory structure, the method includes forming a magnetic tunneling junction structure in an array region, forming a first dielectric layer over the MTJ structure in the array region and a logic region adjacent to the array region wherein the first dielectric layer having a first selectivity, forming a first etch stop layer for an anti-reflective coating etch back operation wherein the first etch stop layer having a second selectivity, and forming a second etch stop layer for a planarization operation over the first etch stop layer wherein the second etch stop layer having a third selectivity. The first selectivity is greater than the second selectivity in the anti-reflective coating etch back operation, and the first selectivity is greater than the third selectivity in the planarization operation.

What is claimed is:

1. A magnetic random access memory (MRAM) structure, comprising:
    an array region; and
    a logic region adjacent to the array region,
    wherein the array region comprises:
        a bottom electrode via (BEVA);
        a magnetic tunneling junction (MTJ) over the BEVA;
        a top electrode over the MTJ;
        a conformable oxide layer over the MTJ and the top electrode; and
        a silicon oxide layer over the conformable oxide layer, wherein the conformable oxide layer and the silicon oxide layer extend from the array region to the logic region.

2. The MRAM structure of claim 1, further comprising a sidewall spacer surrounding the MTJ and the top electrode.

3. The MRAM structure of claim 2, the sidewall spacer further covering a top surface of the top electrode.

4. The MRAM structure of claim 3, further comprising a protection layer over the sidewall spacer covering the top surface of the top electrode.

5. The MRAM structure of claim 4, wherein the protection layer further surrounds the MTJ.

6. A magnetic random access memory (MRAM) structure, comprising:
    a magnetic tunneling junction (MTJ) in an array region;
    a sidewall spacer surrounding the MTJ;
    a protection layer, the protection layer comprises:
        a first portion surrounding the sidewall spacer; and
        a second portion above the sidewall spacer;
    a conductive contact above the MTJ and penetrating the second portion of the protection layer.

7. The MRAM structure of claim 6, wherein a portion of the sidewall spacer is between the second portion of the protection layer and the MTJ.

8. The MRAM structure of claim 6, further comprising a top electrode above the MTJ, wherein a bottom surface of the conductive contact is in contact with a top surface of the top electrode.

9. The MRAM structure of claim 6, further comprising a first oxide layer above the protection layer.

10. The MRAM structure of claim 9, wherein the first oxide layer is in contact with an outer sidewall of the sidewall spacer.

11. The MRAM structure of claim 9, further comprising a second oxide layer above the first oxide layer.

12. The MRAM structure of claim 6, further comprising a low-k dielectric layer surrounding the conductive contact and above the protection layer.

13. The MRAM structure of claim 6, wherein the protection layer comprises silicon carbide (SiC).

14. A magnetic random access memory (MRAM) structure, comprising:
    a silicon carbide layer in a logic region; an MRAM stack in an array region adjacent to the logic region;
    a protection layer above the MRAM stack, wherein a thickness of the silicon carbide layer is thinner than the protection layer;
    a first conductive contact above the MRAM stack; and
    a second conductive contact in the logic region.

15. The MRAM structure of claim 14, further comprising a first oxide layer above the MRAM stack and further extends to the logic region.

16. The MRAM structure of claim 15, further comprising a second oxide layer above the first oxide layer in the array region and the logic region.

17. The MRAM structure of claim 15, wherein the first oxide layer is penetrated by the first conductive contact and the second conductive contact.

18. The MRAM structure of claim 15, wherein a top surface of the first oxide layer in the array region is above a top surface of the first oxide layer in the logic region.

19. The MRAM structure of claim 14, further comprising a silicon oxide layer under the protection layer and extending to the logic region.

20. The MRAM structure of claim 14, wherein the protection layer comprises silicon carbide.

* * * * *